(12) United States Patent
Schoess et al.

(10) Patent No.: US 6,662,647 B2
(45) Date of Patent: Dec. 16, 2003

(54) CONFORMAL FLUID DATA SENSOR

(75) Inventors: Jeffrey N. Schoess, Buffalo, MN (US); Mark D. Simons, Rio Rancho, NM (US)

(73) Assignee: Honeywell International Inc., Morristown, NJ (US)

( * ) Notice: Subject to any disclaimer, the term of this patent is extended or adjusted under 35 U.S.C. 154(b) by 119 days.

(21) Appl. No.: 09/757,443

(22) Filed: Jan. 9, 2001

(65) Prior Publication Data

US 2002/0088277 A1 Jul. 11, 2002

(51) Int. Cl.[7] ............................................. G01P 13/00
(52) U.S. Cl. .................................................. 73/170.02
(58) Field of Search ............................... 73/1.37, 1.51, 73/1.53, 1.78, 170.02, 170.07, 170.11, 178 R, 182; 244/203

(56) References Cited

U.S. PATENT DOCUMENTS

| 5,257,536 A | * | 11/1993 | Beigbeder et al. ....... 73/170.02 |
| 5,458,000 A | | 10/1995 | Burns et al. |
| 5,616,861 A | * | 4/1997 | Hagen ..................... 73/170.02 |
| 5,737,222 A | * | 4/1998 | Palmer ...................... 180/116 |
| 5,772,322 A | | 6/1998 | Burns et al. |
| 5,796,612 A | * | 8/1998 | Palmer ....................... 244/12.1 |
| 5,808,210 A | * | 9/1998 | Herb et al. .................... 73/704 |
| 5,874,671 A | | 2/1999 | Lopez |
| 5,961,080 A | | 10/1999 | Sinha |
| 6,002,972 A | * | 12/1999 | Palmer ....................... 180/116 |
| 6,253,126 B1 | * | 6/2001 | Palmer ................... 244/158 R |

FOREIGN PATENT DOCUMENTS

| DE | 199 23 087 A1 | 5/1999 |
| DE | 199 23 087 A1 | 12/2000 |

* cited by examiner

*Primary Examiner*—Edward Lefkowitz
*Assistant Examiner*—Andre Allen
(74) *Attorney, Agent, or Firm*—Faegre & Benson LLP

(57) ABSTRACT

A gaseous fluid data sensor assembly for acquiring data regarding the ambient environment adjacent a surface of an airframe with adjacent air speeds below 40 knots (or another aerodynamic structure with low speed gaseous fluid flow adjacent thereto) having a flexible substrate adhesively conforming to the airframe surface, a conformable cover layer and a relatively thin air data sensor for sensing air pressure between the substrate and the cover layer. The assembly also includes a fiber optic communication link, a battery, a data acquisition subsystem, and a flexible printed circuit, all between the substrate and the cover layer. The cover layer is formed of a polymer film.

21 Claims, 12 Drawing Sheets

*Fig.* 7

CONFORMAL FLUID DATA SENSOR

FIELD OF THE INVENTION

The present invention relates to the field of fluid data sensing, including airborne vehicle instrumentation, more particularly, to sensors for measuring one or more ambient air parameters adjacent an airflow structure such as an airfoil of an aeronautical structure or an airflow structure in a gaseous fluid flow apparatus such as (but not limited to) a forced air convection heating system.

BACKGROUND OF THE INVENTION

The aviation community has needed ambient air parameter measurements since the advent of instrumented flight. However, prior art sensor technology was typically not able to provide sufficient resolution in a utilitarian form and at an affordable cost for measurement of dynamic pressures associated with air speeds below 40 knots. For this reason, helicopters and V/STOL (vertical/short takeoff and landing) aircraft used active sensing technologies such as radar and laser optical systems with consequent increases in complexity and cost and attendant issues of reliability. In addition, prior art air data sensors characteristically had salient (projecting) profiles with respect to the structural members to which they were attached. The present invention overcomes such shortcomings of the prior art by providing an apparatus capable of measuring temperature and pressure with high resolution regardless of dynamic pressure, in harsh environments and at extreme temperatures while having a streamlined profile integrated with or conforming to the aerodynamic structure on which it is mounted. As used herein, airborne vehicle and aeronautical structure each mean any apparatus intended for passage through air, around which air may be conducted, or through which air is intended to pass, such as aircraft (whether fixed wing or rotary wing), spacecraft, self-powered and un-powered-projectiles (such as missiles and artillery projectiles), and gaseous fluid propulsion machinery (such as turbomachinery, jet engines, rocket engines, and the like).

DETAILED DESCRIPTION OF THE INVENTION

Figure 1:
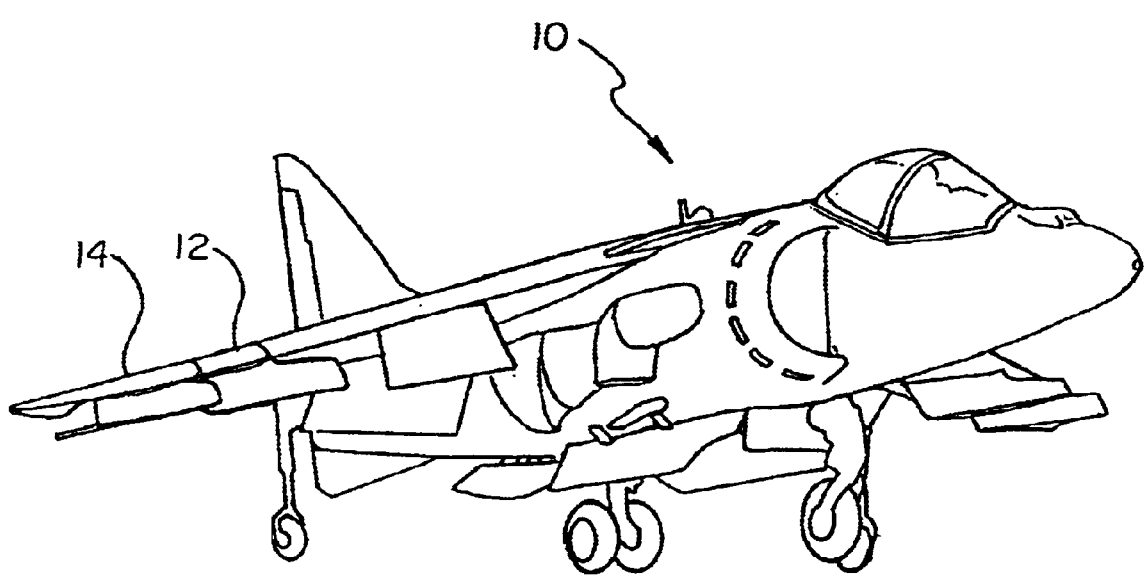
FIG. 1 is a perspective view from below, forward and to the right of an AV-8B Harrier II aircraft useful in the practice of the present invention.
Figure 2:
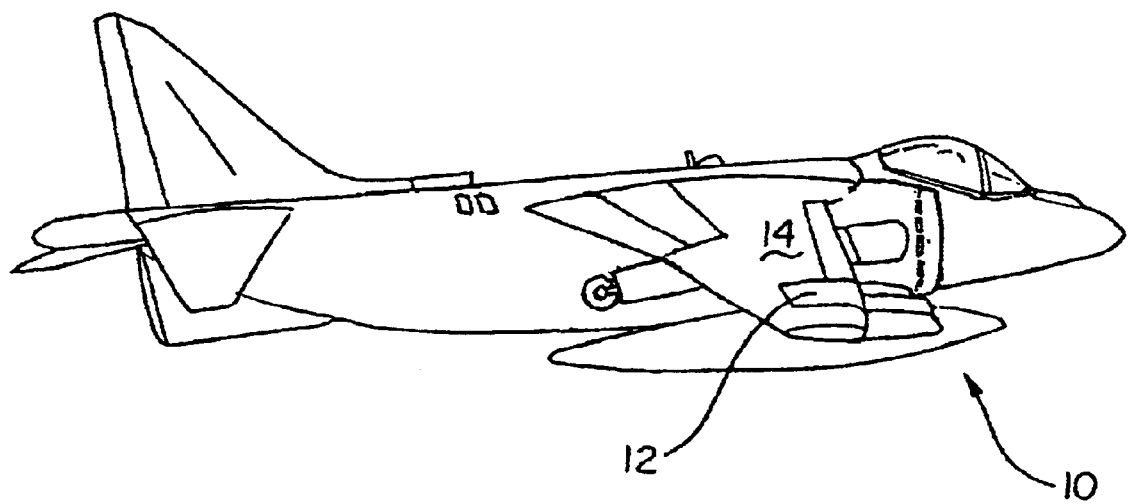
FIG. 2 is a view similar to that of FIG. 1, except from above, slightly aft and to the right to illustrate an example application of the present invention on the upper surface of the wing of the aircraft.
Figure 3:
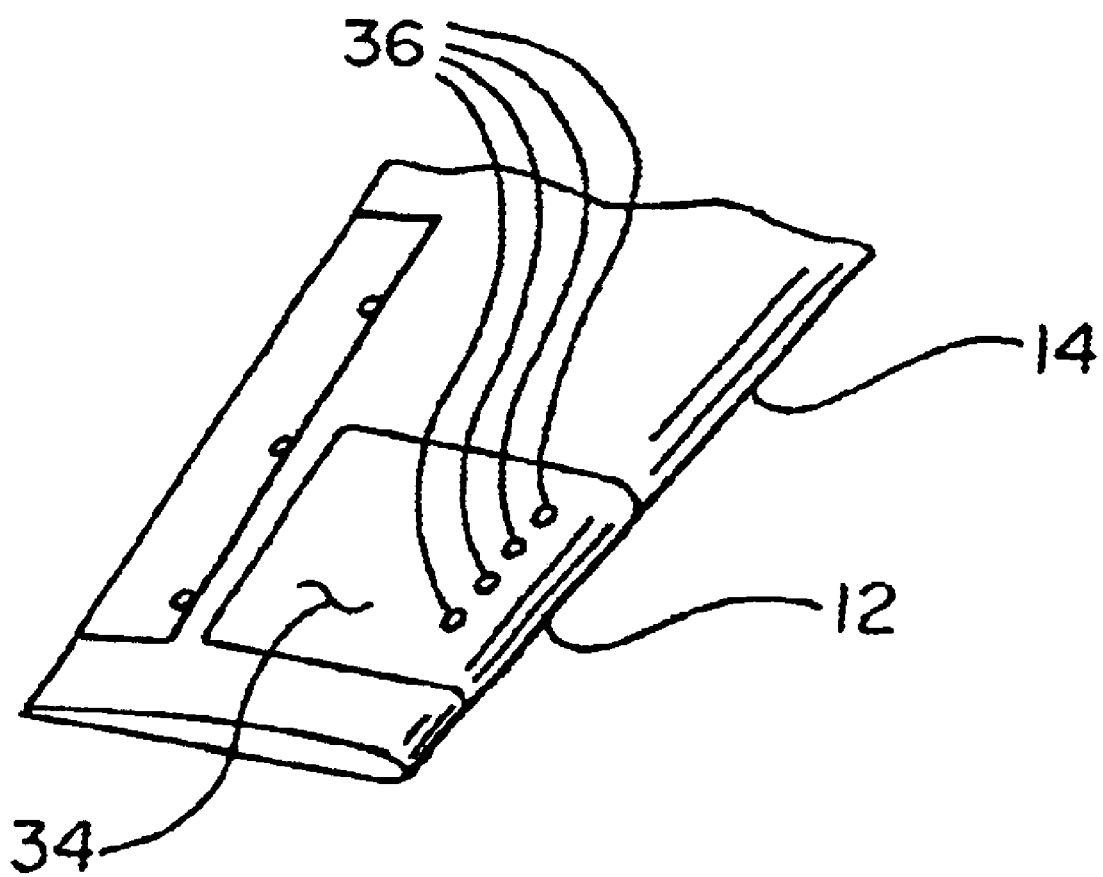
FIG. 3 is a simplified enlarged, fragmentary perspective view of a wing showing an application of the present invention.

Referring now to the Figures, and most particularly to FIGS. 1 and 2, an AV-8B Harrier V/STOL type aircraft 10, as manufactured by The Boeing Company, is shown. Referring now also to FIG. 3, the present invention is shown as a relatively thin patch 12 or layer over part of a wing 14 of the aircraft 10. It is to be understood that the present invention is useful in connection with various airborne vehicles, such as aircraft, rockets and missiles, and projectiles. Such vehicles may be manned or unmanned. The Harrier aircraft is used as an illustration or example application inasmuch as it operates at airspeeds below 40 knots during takeoff and landing. The streamlined aspect of the present invention is useful at higher airspeeds to reduce drag and turbulence.

Figure 4:
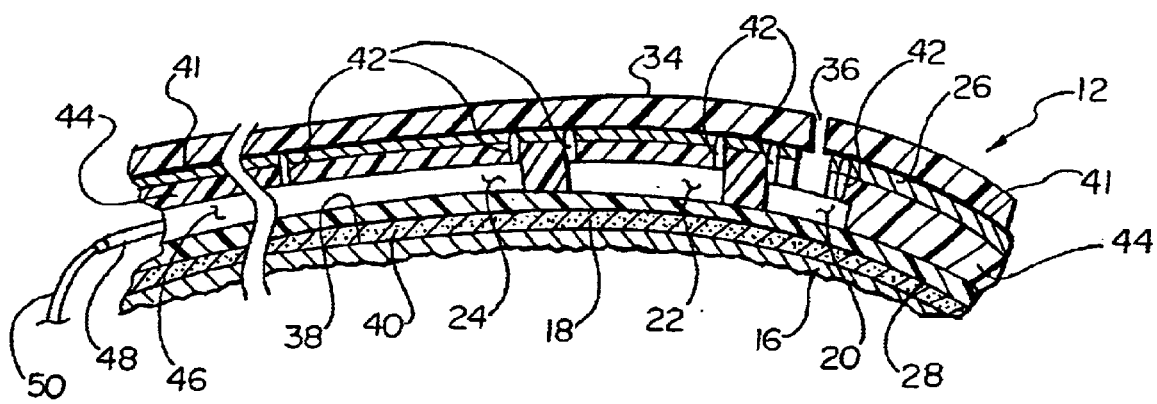
FIG. 4 is a cross sectional view of the present invention as it would appear installed on a wing as shown in FIGS. 2 and 3.

Referring now most particularly to FIG. 4, a cross-section view of the air data sensor assembly 12 may be seen. In this view, the assembly 12 is bonded to a portion 16 of the wing 14 via an adhesive layer 18. A pressure sensor 20 is located within the assembly 12. A data acquisition circuit 22 and battery 24 are also preferably located within assembly 12. The sensor 20, circuit 22, and battery 24 are mechanically and electrically interconnected via a flexible printed circuit layer 26. Battery 24 is preferably a ½ mil thick polymer rechargeable lithium battery available from Ultralife Battery, Inc. having an address at 2000 Technology Parkway, Newark, N.Y. 14513 as part number: EL 27.

Figure 5:
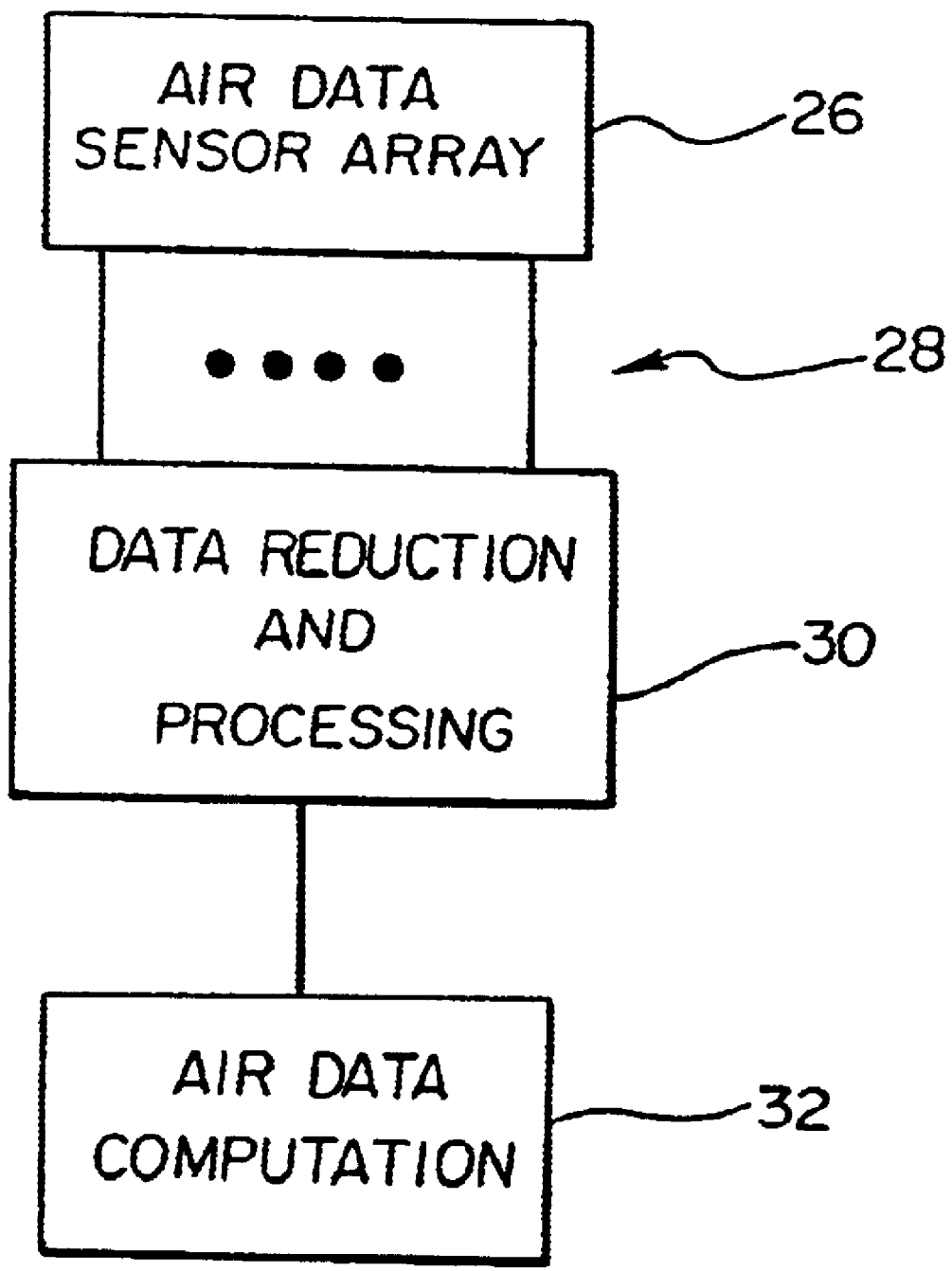
FIG. 5 is a simplified block diagram of a system interconnection useful in the practice of the present invention.
Figure 6:
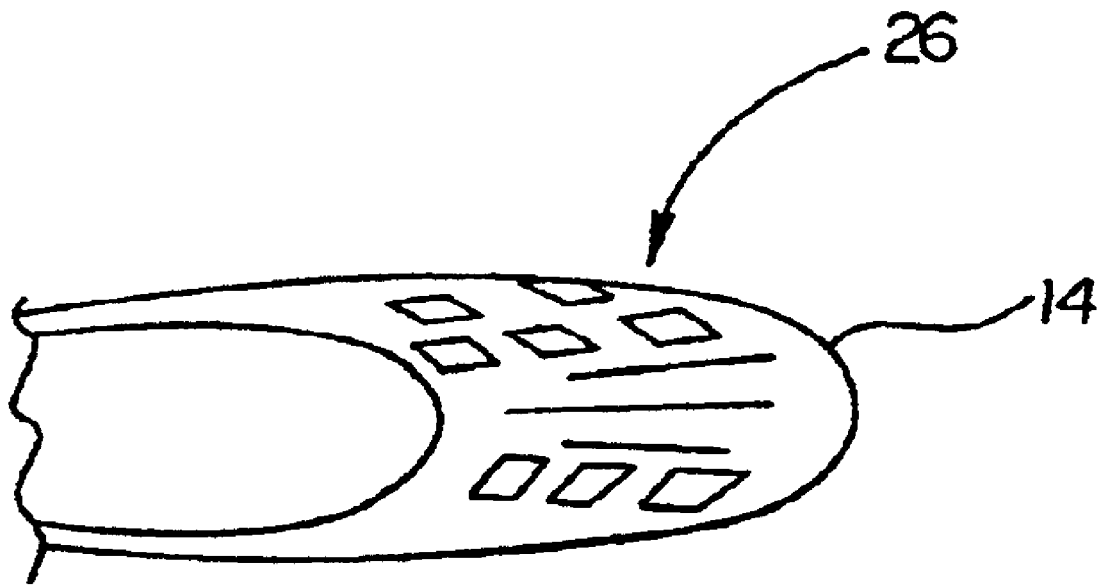
FIG. 6 is a side view of an airframe structure such as a wing carrying an array of air data sensors of the present invention.
Figure 7:
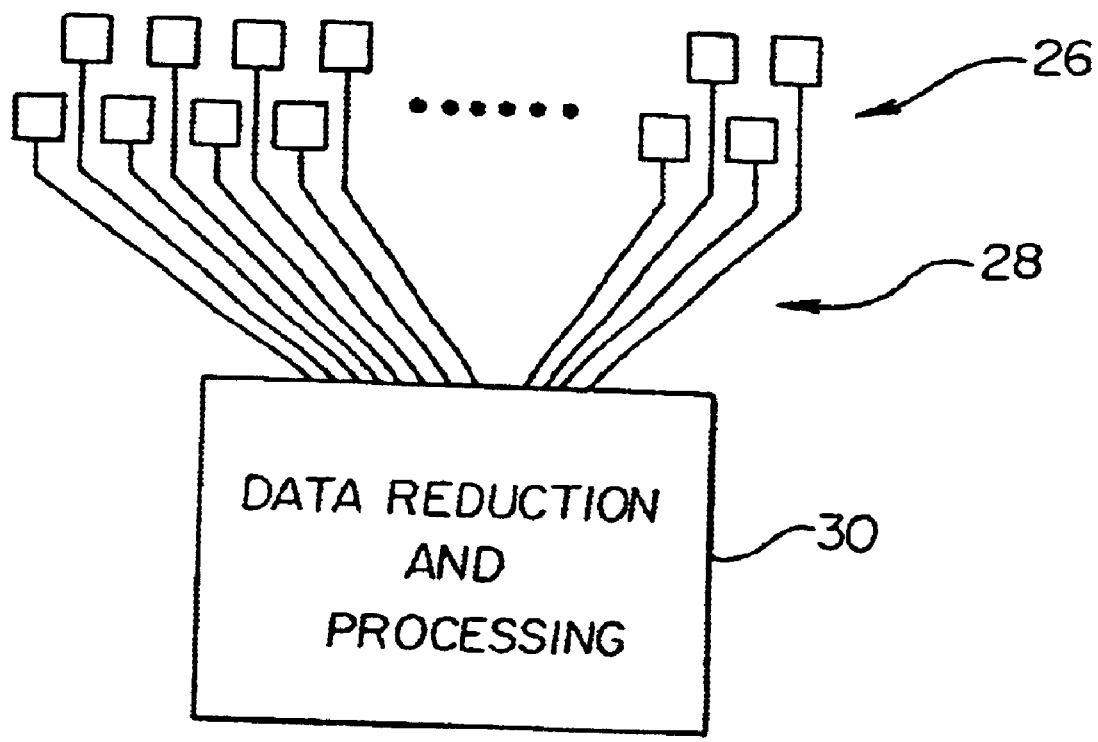
FIG. 7 is a simplified block diagram of the array of FIG. 6 connected to a data reduction and processing block similar to that shown in FIG. 5.

As shown in FIG. 5 in a preferred embodiment of the present invention, an array or plurality 26 of sensors such as sensor 20 are co-located below a fluoropolymer layer 34 having a total thickness of 6–10 mil. Such sensors could be temperature and pressure sensors, or other air data sensors, as desired. It is to be understood that temperature is necessary to correct the air pressure readings. One example of an absolute pressure transducer is disclosed in U.S. Pat. No. 5,808,210. The sensors provide data via a network of optical fibers in an optical fiber layer 28 to an electronic data reduction and processing block 30 (see FIGS. 5 and 7). The optical fiber layer 28 also can be used to provide power to the sensors 20. The resonating integrated microstructure sensors may be optically energized by an embedded photodiode located in the microbeam structure. As incident light is coupled to the sensor via an optical fiber and a collimating graded index lens, the photodiode establishes an "etalon effect" causing the microbeam to be excited into a resonant mode of operation. The principle of operation for the optical sense and drive for such a sensor is presented in U.S. Pat. No. 5, 808,210.

The optical fibers in layer 28 may be collected and terminated in standard optical fiber cable connectors. The optical fiber cable connectors are connected to a universal signal conditioner and remote input/output unit in block 30. Block 30 converts the optical signals to air temperature and pressure signals, which are used by the Air Data Computation Block 32 to compute altitude and airspeed from the pressure and temperature according to well-known techniques.

The present invention may be used to provide a minimally invasive pressure measuring instrument for characterizing the boundary layer fluid flow on an aerodynamic surface such as an airplane wing or a inside turbo-machinery such as a turbine engine. By conforming closely to the contour of the surface to which it is attached, there will be minimal or even negligible effect on the fluid flow characteristics in the boundary layer being sensed.

In the practice of the present invention, the air data sensor (such as an air pressure sensor 20), a data communications network (in layer 28), data acquisition circuits 22 and mechanical support are all combined in a single ultra low profile conforming package 12. The package or patch 12 includes a conformal layer 34 for environmental protection which includes a plurality of ports or apertures 36. Layer 34 is preferably a fluoropolymer film such as that manufactured by the 3M Company of St. Paul, Minn. under the product number 500 as aircraft paint replacement film in thicknesses of 3.5 to 10 mils. In addition to providing a protective cover, film 34 serves as a flexible layer for mounting the components of the system in a manner to be described infra.

Referring now again to FIG. 4, the instrument package 12 is preferably adhesively bonded to an airframe surface 38. An adhesive layer 40, preferably in the form of a pressure sensitive adhesive formed in a commercially available acrylate process to a thickness of about 1.5 mils initially has a backing or release layer (not shown) which is removed immediately prior to installation on the surface 38. The air data sensor 20, data acquisition circuit 22 and conformal rechargeable battery 24 are all preferably mounted on film 34 which eventually will form a conformable cover layer for the instrument package 12. It is to be understood that one or more sensors 20 (which may include pressure sensors and temperature sensors), circuit 22, and battery 24 are each connected electrically and mechanically to cover layer 34. The conformable assembly 12 is preferably about 6–10 mils thick, with layer 34 acting as a base for a flexible printed circuit, providing electrical interconnects and mechanical relief support, in addition to being an environmental cover. The flexible printed circuit on layer 34 is preferably a 1 mil thick conductive polymer thick film 41, deposited on the backside of layer 34 using stencil, screen printing, or ink-jet processing techniques. The electrical components and pressure sensor are preferably interconnected to the flexible printed circuit using conventional surface mounting techniques utilizing solder bumps 42. Additional mechanical support may be provided by adding a layer 44 of about 0.5 mils thick epoxy coating compound to bond the sensors 20 and related components to layer the polymer film layer 41 and cover layer 34.

The optical fiber layer 28 is a flexible substrate preferably formed of polyimide about 200 microns thick to provide optical interconnections between the sensors 20 and the data acquisition circuit 22 and to an optical fiber to waveguide coupler 46, which has a strain relief 48 for a multimode fiber optic cable 50 connecting the instrument package 12 to high temperature data processor 32 (see FIG. 5). Using fiber optic interconnects enhances electromagnetic interference immunity, by limiting effects to the local processing area only. It is to be understood that the data acquisition circuit 22 converts the optical signals to one or more (preferably digital) electrical signals for further processing.

Figure 8:
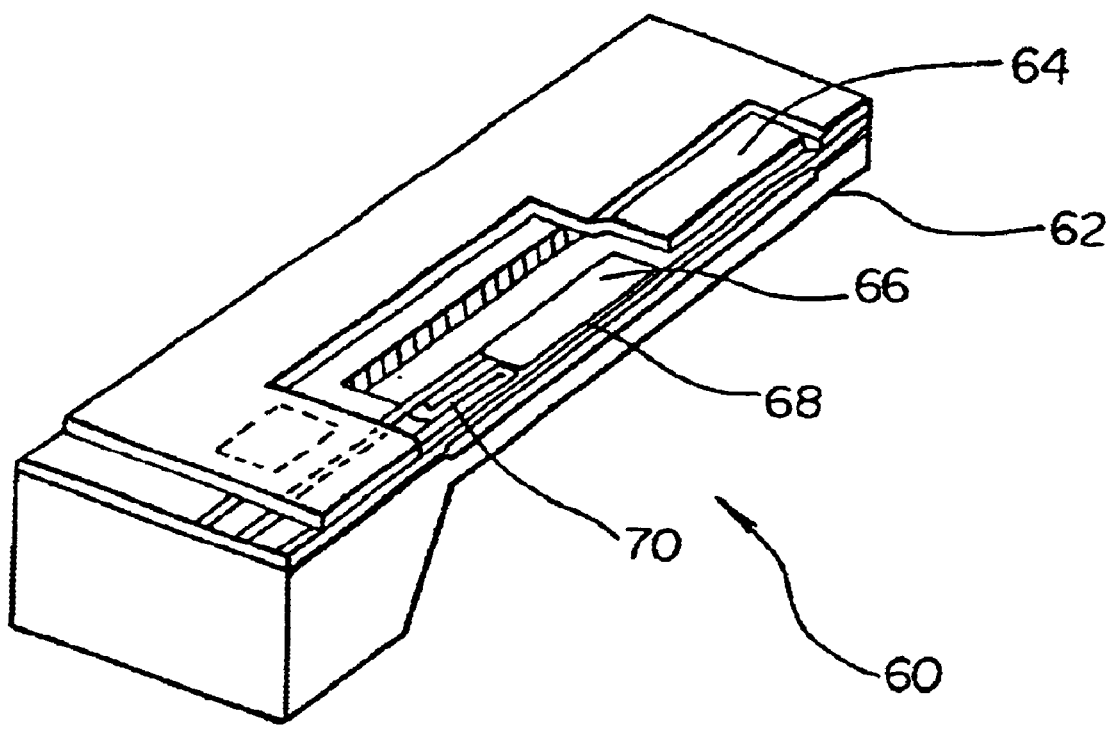
FIG. 8 is a simplified perspective view resonant microbeam sensor useful in the practice of the present invention.
Figure 9:
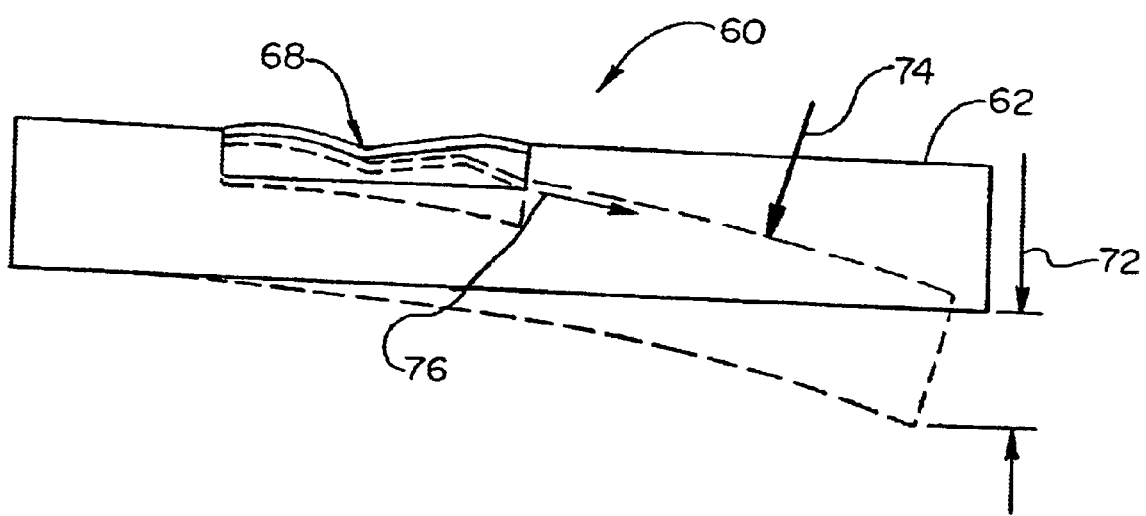
FIG. 9 is a side view of the sensor of FIG. 8 in a relaxed state and in a deflected state.
Figure 10:
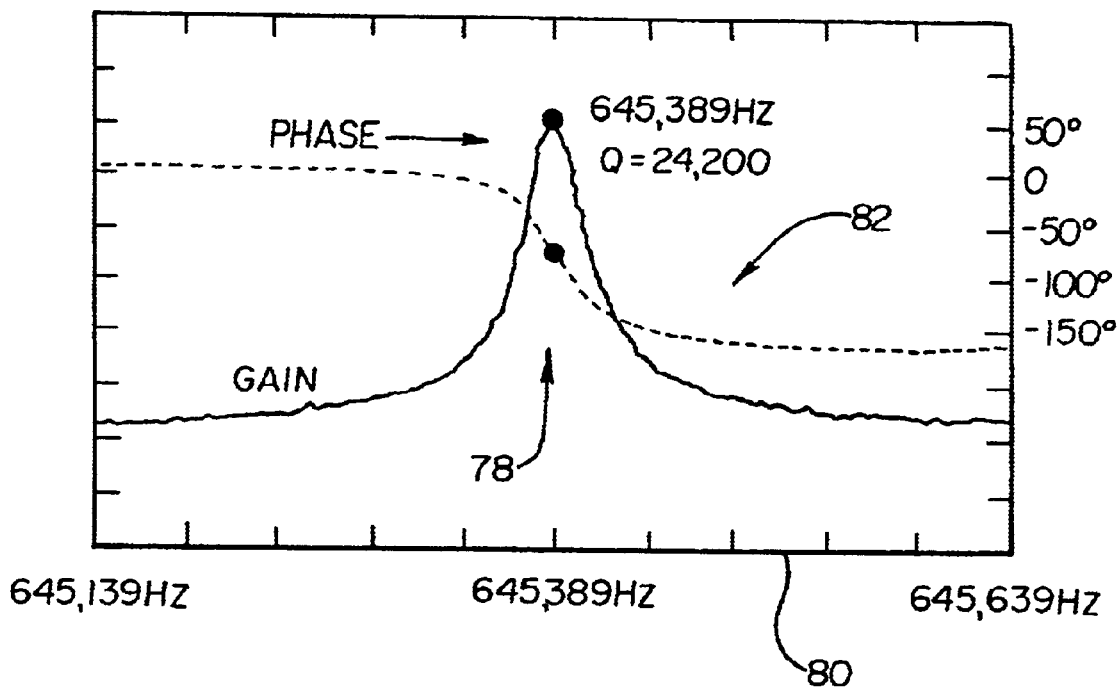
FIG. 10 is a plot of the gain and phase response versus frequency of the sensor shown in FIGS. 8 and 9.

Referring now to FIGS. 8, 9 and 10, certain aspects of one embodiment for the air data sensor 20 for sensing pressure may be seen. In FIGS. 8 and 9 a resonant microbeam sensor assembly 60 are illustrated. FIG. 8 is a partially cut away view of the sensor assembly 60 having a cantilever mounting arm 62 having a vacuum cavity enclosure 64, a drive electrode 66, a microbeam 68, and a sense resistor 70. As illustrated in FIG. 9, when the cantilever mounting arm 62 is deflected a distance 72 by an applied force 74, the resonating microbeam 68 will have a resulting axial force increase, indicated by arrow 76.

FIG. 10 shows the gain and phase response for the assembly 60. As force 74 is applied, the resonant frequency and frequency at which the phase shift occurs will change, with the frequency increasing with an increase in applied force. The change in air pressure sensed at port 36 results in a change in force 74 applied to arm 62, detected as a shift in the resonant frequency 78 along the abscissa or horizontal axis 80 of response characteristics 82 of the resonating microbeam 68.

The instrument package 12 is fabricated by creating the flexible printed circuit 41 on cover layer or film 42, after which components 20, 22, and 24 are electrically connected via solder connections 42. Epoxy layer or flexible potting compound 44 is applied to fill the spaces adjacent components 20, 22, and 24, and the optical fiber interconnect layer 28 with coupler 46 is attached to the components and epoxy layer. The coupler 46 and the pressure sensitive adhesive layer 40 may be attached to the flexible substrate layer 28 before or after assembly to the remainder of package 12.

Figure 11:
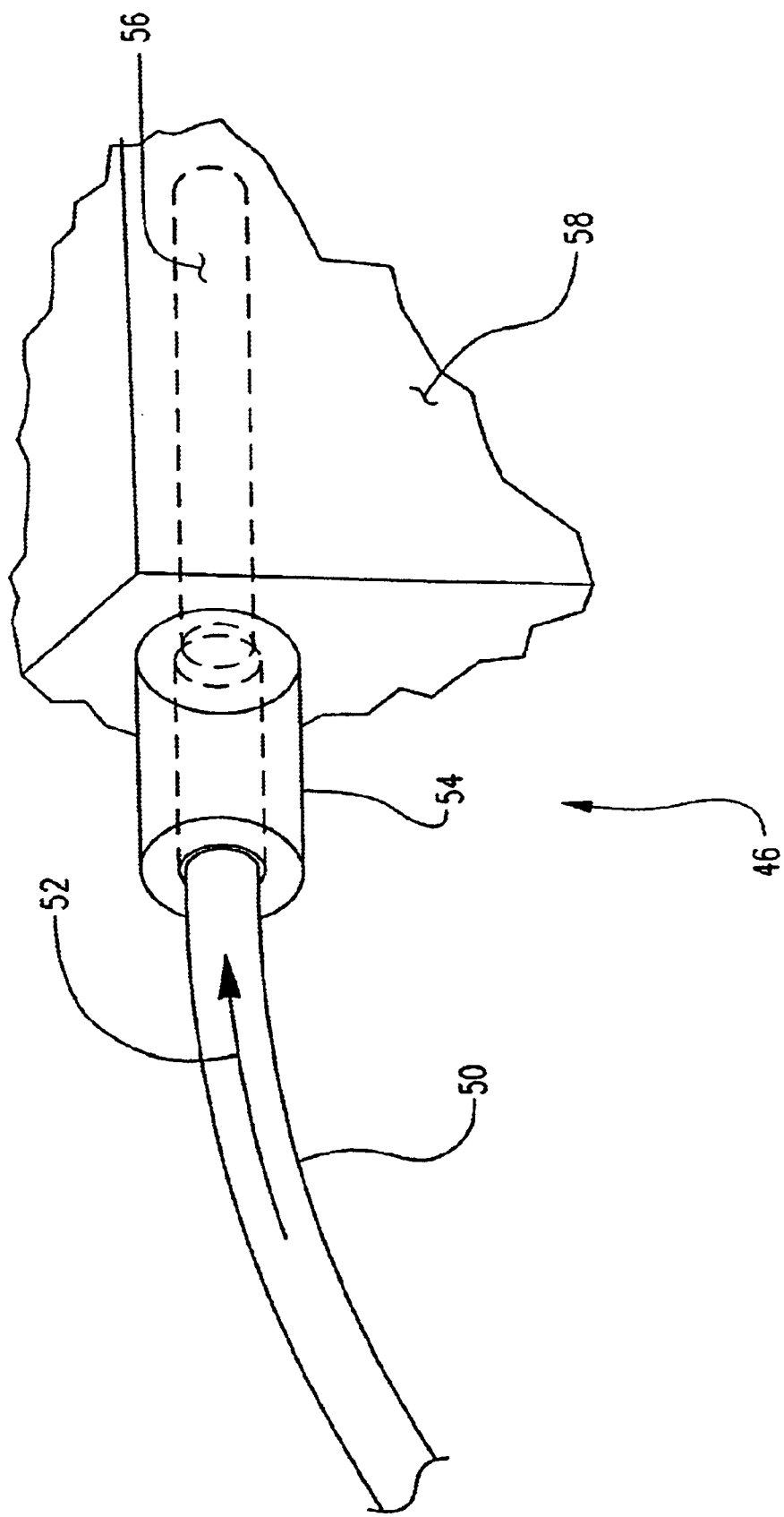
FIG. 11 is an enlarged view of an optical fiber interface useful in the practice of the present invention.

Referring now to FIG. 11, an enlarged view of an optical fiber interface or coupler 46 useful in the practice of the present invention may be seen. Optical fiber cable 50 is received in the strain relief 48 within a gradient index lens 54 which is optically coupled to an optical waveguide or etched cavity 56 in silicon chip subsystem 58. Incident light is indicated by arrow 52.

Figure 12:
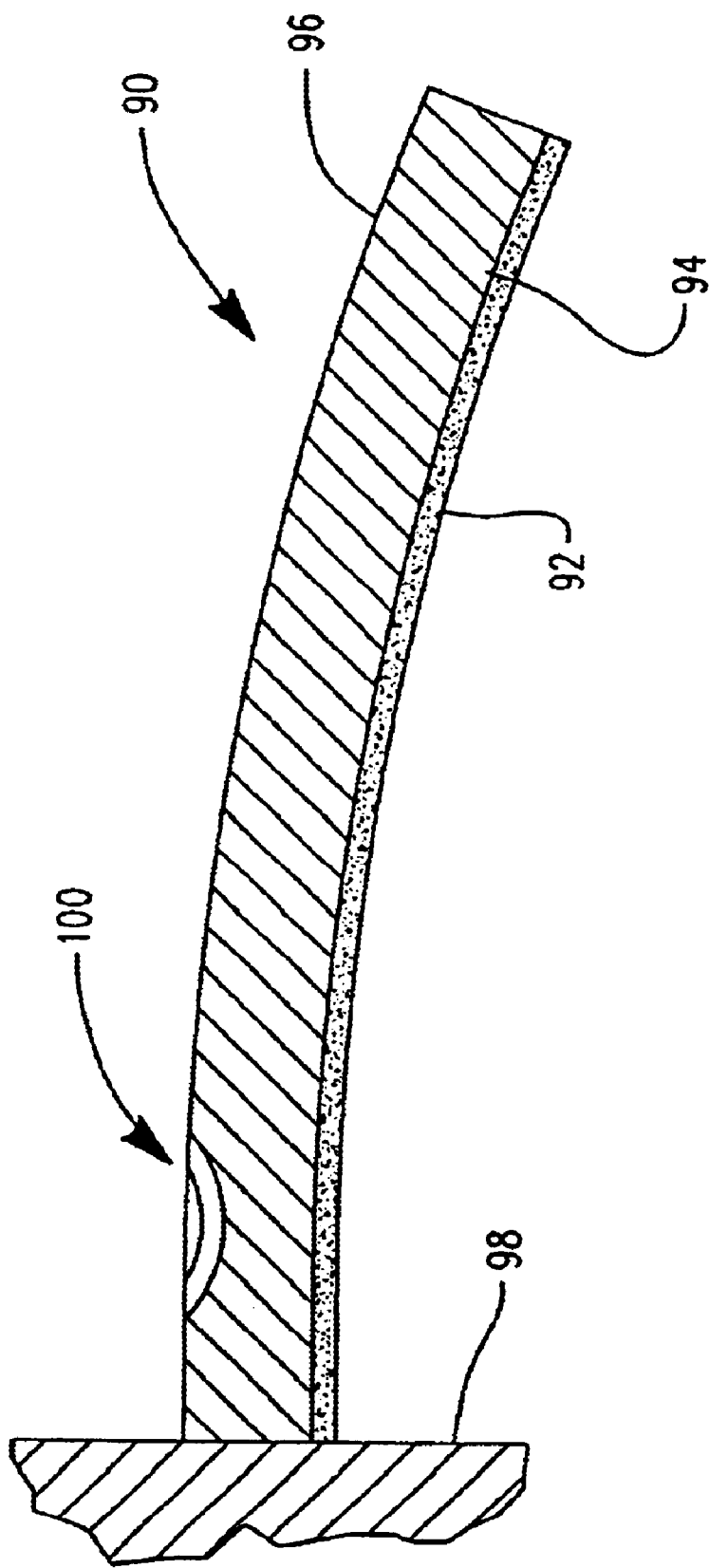
FIG. 12 is a section view of a cantilevered microbeam shown to illustrate a temperature sensor useful in the practice of the present invention.

Referring now to FIG. 12, a simplified view of a microbeam temperature sensor 90 useful in the practice of the present invention may be seen. The measurement of air temperature to provide correction of air pressure readings may be accomplished by incorporating an additional resonating integrated microstructure sensor 90 into the air data sensor system. Resonant microbeam temperature sensing is known from U.S. Pat. No. 5,772,322. The structure for temperature sensor 90 includes a conforming metallization layer 92 of a precious metal such as gold or platinum applied to one side 94 of a bulk silicon cantilever beam 96 via a sputtering process or equivalent semiconductor method. The coefficients of thermal expansion of the two dissimilar layers causes the mechanical stiffness of the cantilever beam 96 to change according to the temperature to which the beam 96 is exposed. The air data and temperature sensor 90 is preferably packaged as an array of two active devices located adjacent to each other on a common silica substrate 98. Beam 96 also preferably carries resonating integrated microstructure 100. The active devices are interrogated by a further optical fiber (not shown) co-located with the air pressure optical fiber 50 at the end of the conformal sensor package 12. Static compensation of resonant microbeam sensor technology is disclosed in U.S. Pat. No 5,458,000.

In practice, the instrument package 12 of the present invention may be fabricated and stored in roll form with the release layer attached, until it is desired to install the package 12 on an airframe member, at which time the package and release layer is unrolled, the release layer removed, and the package or patch 12 applied by hand pressure to the surface adjacent which air data is to be taken. The cable 50 is preferably connected via conventional fiber optic cable connectors to data processing equipment (not shown) to provide air data for the boundary layer adjacent the surface to which patch 12 is attached. The overall thickness of instrument package 12 is about 10 mils or 0.010 inches thick.

This invention is not to be taken as limited to all of the details thereof as modifications and variations thereof may be made without departing from the spirit or scope of the invention. For example, the present invention may be used to advantage on an interior surface of a turbine engine or other structure requiring streamlined airflow. Furthermore, the present invention may be used in conventional gaseous fluid flow structures such as process equipment and space heating.

What is claimed is:

1. A conformable air data sensor assembly for sensing a low airspeed parameter comprising:
   a. a flexible substrate;
   b. a conformable cover layer; and
   c. a thin air data sensor located between the flexible substrate and the conformable cover layer forming an assembly for sensing a low airspeed parameter adjacent the conformable cover layer when the assembly is conformably secured to a surface of an airborne vehicle.

2. The assembly of claim 1 wherein the sensor is secured to the conformable cover layer.

3. The assembly of claim 1 wherein the conformable cover layer comprises a polymeric material.

4. The assembly of claim 1 wherein the flexible substrate comprises an optical fiber layer.

5. The assembly of claim 1 wherein the combined thickness of the substrate, cover layer and air data sensor is about 0.010 inches.

6. The assembly of claim 1 further comprising:
   d. an adhesive layer secured to the flexible substrate for adhering the assembly to the surface of a structure where adjacent air data is desired.

7. The assembly of claim 1 wherein the cover layer further comprises a flexible printed circuit electrically connected to the air data sensor.

8. The assembly of claim 1 wherein the air data sensor further comprises an air pressure sensor.

9. An air data sensor assembly comprising:
   a. an array of air data sensors located in the assembly mounted on an aerodynamic surface for detection of surface dynamic pressure associated with airspeeds below about 40 knots;
   b. a protective cover layer formed of a polymer material;
   c. a data acquisition circuit located in the assembly; and
   d. a flexible substrate forming an interconnection path between the data acquisition circuit and each of the air data sensors in the array wherein at least the array of air data sensors and data acquisition circuit are mounted on the protective cover layer.

10. The air data sensor assembly of claim 9 wherein the aerodynamic surface has a leading edge and at least some of the air data sensors are located in the region of the leading edge of the aerodynamic surface.

11. The air data sensor assembly of claim 9 wherein at least one air data sensor comprises a resonant microbeam having a resonant frequency shift in response to air pressure changes.

12. A method of sensing ambient air data adjacent an airborne vehicle comprising the steps of:
    a. forming a conformable air data sensor assembly having at least one thin air data sensor located between a conformable cover layer and a flexible substrate with an adhesive located on an exterior surface of the flexible substrate, where the cover layer has at least one aperture therein and the assembly has an output for providing a signal representative of air data;
    b. adhering and conforming the sensor assembly to a surface of an aeronautical vehicle using the adhesive on the flexible substrate and connecting the output of the assembly to an air data computation apparatus; and
    c. monitoring the output of the air data sensor assembly for the signal representative of air data associated with the ambient air conditions adjacent the aperture without substantial interference with the airflow characteristics of the surface on which the assembly is attached.

13. The method of claim 12 further comprising an additional step a1 between steps a and b, comprising:
    a1. storing the air data sensor assembly in a rolled form, along with a plurality of other air data sensor assemblies with a release layer attached to the adhesive to prevent the adhesive from adhering to an adjacent layer of the air data sensor assemblies while in rolled form.

14. The method of claim 13 further comprising an additional step a2 between steps a1 and b, comprising:
    a2. detaching one air data sensor assembly from an adjacent air data sensor assembly and removing the release layer from the adhesive on the flexible substrate.

15. The method of claim 12 wherein the air data sensor assembly includes a resonant microbeam air pressure sensor for providing a signal representative of ambient air pressure adjacent the aperture in the cover layer.

16. The method of claim 15 wherein changes in ambient air pressure result in a shift in a resonant frequency of the resonant microbeam causing a change in the signal representative of ambient air pressure.

17. A conformable sensor assembly comprising sensors for sensing gaseous fluid pressures from zero to very high dynamic levels comprising:
    a. a flexible substrate;
    b. a conformable cover layer; and
    c. a thin gaseous fluid sensor located between the flexible substrate and the conformable cover layer forming an assembly for sensing at least one gaseous fluid parameter adjacent the conformable cover layer when the assembly is conformably secured to a surface adjacent the gaseous fluid flow.

18. The assembly of claim 17 wherein the at least one gaseous fluid parameter comprises pressure.

19. The assembly of claim 18 wherein the gaseous fluid is air.

20. The assembly of claim 18 wherein the at least one gaseous fluid parameter further comprises temperature.

21. The assembly of claim 20 wherein the temperature is used to compensate the pressure.

* * * * *